United States Patent [19]

Hayes

[11] 4,446,916

[45] May 8, 1984

[54] HEAT-ABSORBING HEAT SINK

[76] Inventor: Claude Q. C. Hayes, 7980 Linda Vista Rd. #49, San Diego, Calif. 92111

[21] Appl. No.: 292,639

[22] Filed: Aug. 13, 1981

[51] Int. Cl.³ .......................................... H01L 23/42
[52] U.S. Cl. ................................... 165/185; 165/10; 165/104.17; 165/DIG. 4; 174/16 HS
[58] Field of Search ........ 165/185 R, 185 A, DIG. 4, 165/47 A, 53, 10 A, 10 R, 104.17, 104.26, 104.12, DIG. 17; 361/386; 74/16 HS

[56] References Cited

U.S. PATENT DOCUMENTS

| | | | |
|---|---|---|---|
| 2,677,367 | 5/1954 | Telkes | 165/10 A |
| 2,964,688 | 12/1960 | McAdam | 165/80 B |
| 3,780,356 | 12/1973 | Laing | 165/185 X |
| 3,972,821 | 8/1976 | Weidenbenner et al. | 165/185 X |
| 4,003,426 | 1/1977 | Best et al. | 165/53 |
| 4,057,101 | 11/1977 | Ruka et al. | 165/185 X |
| 4,135,371 | 1/1979 | Kesselring | 165/104.12 |
| 4,187,189 | 2/1980 | Telkes | 165/47 A |
| 4,233,645 | 11/1980 | Balderes et al. | 361/386 X |
| 4,299,715 | 11/1981 | Whitfield et al. | 165/185 X |
| 4,341,262 | 7/1982 | Alspaugh | 165/10 A |

FOREIGN PATENT DOCUMENTS

| | | | |
|---|---|---|---|
| 600823 | 6/1960 | Canada | 165/DIG. 4 |
| 1153115 | 3/1958 | France | 165/185 |

OTHER PUBLICATIONS

Chip Cooling Employing a Conformable Alloy, Hassan et al., I.B.M. Technical Disclosure Bulletin, vol. 24, No. 11A, pp. 5595-5597.

Primary Examiner—Sheldon J. Richter
Attorney, Agent, or Firm—Laurance E. Banghart

[57] ABSTRACT

An improved heat sink device for transferring heat from a heat generator to lower-temperature surroundings comprising a device-embedded compound that absorbs heat, delaying temperature rise in the heat generator, at a specific temperature by melting or entering into an endothermic chemical change or reaction and which is absorbed and retained within the device by a mesh or fabric of a multiplicity of fibers.

12 Claims, 7 Drawing Figures

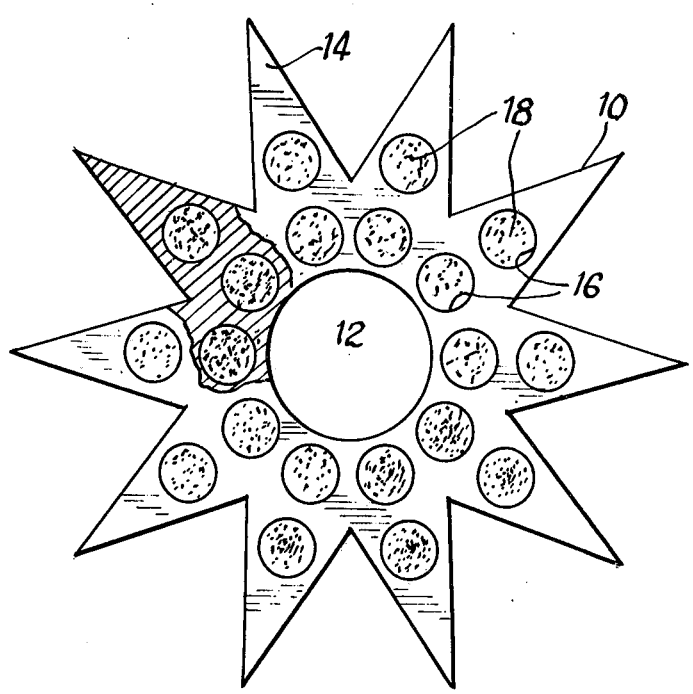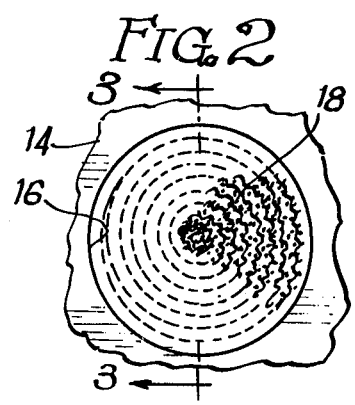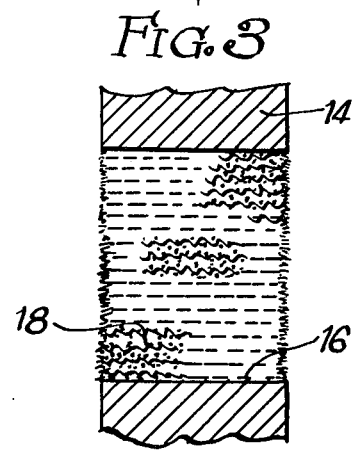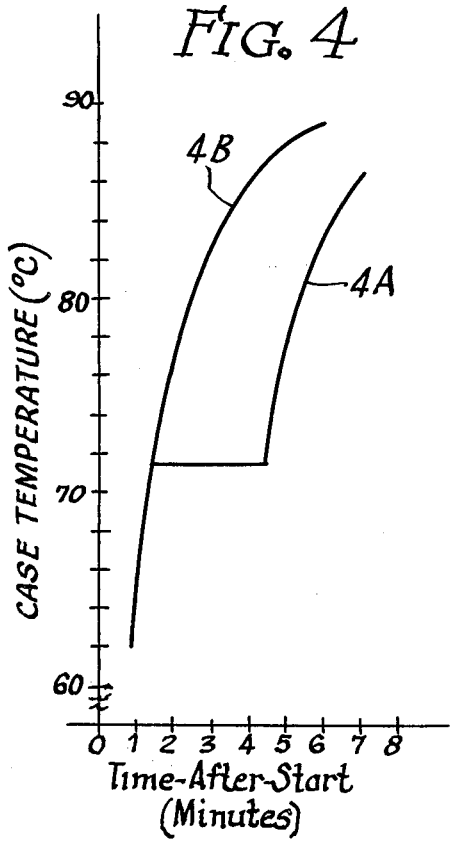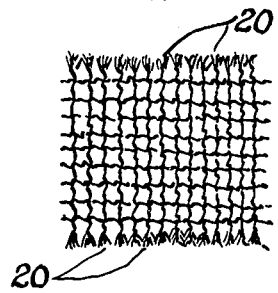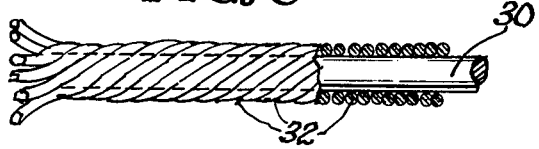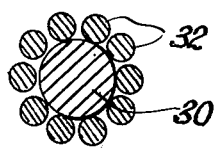

HEAT-ABSORBING HEAT SINK

BACKGROUND OF THE INVENTION

Heat sink has been the traditional name for devices that transfer heat from a heat generator to lower-temperature surroundings with a design objective of minimizing the temperature rise between the heat generator and the surroundings. The purpose is to keep the temperature of the heat generator low to prevent performance degradation or destruction of the generator. Electronic equipment and components wherein a temperature of 50° C. represents a benign environment, but 120° C. represents complete destruction, use heat sinks in great abundance and variety.

The heat sinks of this invention not only transfer heat, they absorb heat. Obviously heat absorption can only exist in a transient situation and a major purpose of such heat sinks is to delay temperature rise until the equipment is no longer required to operate or until the temperature of the surroundings goes down.

Delay in temperature rise can be vitally important. Missiles and space vehicles are only subjected to intense heat for periods of several minutes and often their equipment is only required to operate for several minutes. There are a multitude of other examples wherein heat removal for a short time is a key design requirement.

Two heat-absorbing phenomina are used here. One occurs when using a melting compound in the heat sink. Any solid when melting absorbs heat without temperature rise. The quantity of heat absorbed to convert a unit solid mass to liquid mass at the same temperature is called the latent heat of fusion. The other phenomina occurs when using a compound in the heat sink that undergoes a chemical change at a specific temperature, absorbing heat. Such a reaction is called an endothermic reaction.

It is clear that a change of a solid to a liquid creates the problem of containing the liquid that was once a solid. Similar changes occur in endothermic reactions. Melting compounds have been sealed inside cavities in heat sinks so as not to escape in liquid form. This involves sealing problems including allowance for expansion with temperature, and does not improve heat transfer by covection and radiation as is accomplished by the invention here. The use of heat-absorbing compounds in heat sinks does not appear in any known patent.

SUMMARY OF THE INVENTION

A major object of this invention is to provide improved heat sinks that absorb heat, delaying temperature rise, at the melting temperature of a compound embedded within a mesh or fabric of fibers that retains the compound when liquid by capillary action and chemical adhesion. These phenomena are most frequently observed in the way multi-strand wires absorb and retain melted solder. The mesh or fabric, with melting compound embedded, can be used in a variety of ways. It can be wrapped in one or more layers around cylindrical heat generators such as transistors or pipes carrying hot fluids. It can be rolled into cylindrical shapes and installed into round holes in a solid heat sink.

Another object of this invention is to provide improved heat sinks that absorb heat, delaying temperature rise, at the temperature of endothermic chemical change or reaction of a compound embedded within a mesh or fabric or fibers that retains the compound both above and below the temperature of change. While this reaction in some applications may be non-reversible (absorbing heat on first temperature rise only), it is an object of this invention to also provide a reversible reaction when heat generation will occur more than once in the application.

Another object of the invention is to provide a heat-absorbing mesh of high heat conductivity when the mesh is used in thick sections. Otherwise temperature differentials could exist within the heat sink and temperature rises above the critical temperature could occur without some of the heat-absorbing compound being exposed to the critical temperature. When the heat-absorbing mesh is used in thin sections, high heat conductivity of the mesh is not a major concern and the normal criteria of time delay in temperature rise, weight, volume, radiation and convection transfer efficiency, and cost are the predominent criteria.

Another object of this invention is to provide heat sinks with improved convection and radiation heat-transfer characteristics. The mesh employed can greatly increase the surface area of the heat sink as compared to the mass or volume of the heat sink. The mesh may have frayed fiber ends increasing the radiation surface area and creating micro turbulence in the stream of convection flow. Fibers perpendicular to the mesh surface may be embedded into the mesh further increasing the micro turbulence and the effective surface area.

BRIEF DESCRIPTION OF THE DRAWINGS

The invention will be better understood by reference to the following figures in which:

FIG. 1 is a plan view, partly in section, of one embodiment of the heat-absorbing heat sink;

FIG. 2 is a plan view of one of the many heat-absorbing portions of the heat sink of FIG. 1;

FIG. 3 is an elevation section view of the heat-absorbing portion of FIG. 2, taken approximately on the line 3—3 of FIG. 2;

FIG. 4 is a graph of temperature versus time for the heat-absorbing heat sink of FIG. 1;

FIG. 5 is a plan view of a mesh or fabric of a multiplicity of fibers containing an embedded heat-absorbing compound;

FIG. 6 is a longitudinal view, partly in section, of a metallic yarn made up of a central filament of a heat-absorbing compound twisted and wrapped with many smaller diameter metallic wires; and FIG. 7 is a transverse section view of the yarn of FIG. 6.

DETAILED DESCRIPTION

Referring now to FIG. 1, a plan view of a heat sink of one embodiment of this invention is shown. A metallic, star-shaped heat sink 10 surrounds a heat-generating power transistor to be inserted at 12. The star shape is conventional, aiding in heat transfer by convection and radiation. The star-shaped metal piece 14 has many cylindrical openings 16 to surround heat-absorbing compound embedded in cylindrical rolls of wire mesh 18.

FIG. 2 shows a plan view of one of the cylindrical rolls of wire mesh 18 with embedded heat absorbing compound. The mesh is rolled to a diameter approximately equal to the diameter of the opening 16 in the star-shaped metal piece 14 and press fit into the metal. All openings 16 are similarly filled.

FIG. 3 shows a section view of one of the cylindrical rolls of wire mesh 18 in place in an opening 16 in the star-shaped piece 14.

This embodiment of the invention uses thick sections of mesh and heat-absorbing compound. It is clear that the mesh fibers must have high heat conductivity to avoid appreciable temperature differentials within the heat sink. Metal fiber is a clear choice. Copper has very high conductivity and also absorbs and retains a wide variety of heat-absorbing materials. A heat-absorbing compound well suited for this application is a tertiary eutectic alloy of Bismuth, Lead and Tin. The melting point can be adjusted, by adjusting the proportions of the elements in the compound, over the appropriate temperature range of 70° C. to 85° C. Copper mesh can absorb and retain these alloys to the extent that the mass of the contained alloy is as great as the mass of the mesh. For Application requiring a higher melting temperature, Cadmium, Silver, Gold, Antimony and Mercury are effective constituents of the heat-absorbing compound.

FIG. 4A shows case temperature versus time-after-start for a transistor installed in a heat sink of the type just described. The temperature of the surroundings is 40° C. and the melting temperature of the Bismuth, Lead, Tin alloy is approximately 72° C.

FIG. 4B shows case temperature versus time-after-start for the same conditions except that there are no cylindrical openings 16 in the star shaped metal piece 14 and thus no heat-absorbing compound in the heat sink. This curve shows the performance of an equivalent conventional heat sink.

Suppose that in a missile application, the transistor is required to operate for 4.5 minutes. With the heat sink of this invention the transistor case temperature would not go above 72° C., FIG. 4A. With a conventional heat sink of the same size and weight, the transistor case temperature would go to a dangerous 88° C., FIG. 4B.

FIG. 5 shows a fiber mesh made with frayed ends 20. These frayed ends when exposed as a surface of the heat sink greatly increase radiation surface area and will create micro turbulence in the stream of convection flow. This increases transfer efficiency of the heat sink in the conventional sense. The mesh may be woven of multifilament yarn. When the heat-absorbing compound is used in thin sections, and high heat conductivity is not required, the mesh may be a common cloth made of cotton, nylon, or linen fibers. In these cases waxes, either animal or mineral, have great utility as the heat-absorbing compound. A wide variety of melting points is available. Waxes are retained very well by non-metallic cloth, and have a high latent heat of fusion.

FIG. 6 and FIG. 7 show a preferred metallic yarn for weaving into a mesh for use in the heat sinks of this invention. A central filament 30 of heat-absorbing compound is wrapped with many smaller diameter metallic filaments 32. The cross sectional area of the central filament is essentially equal to the total cross sectional area of the metallic filaments wrapped around it. This method of construction allows a maximum amount of heat-absorbing compound to be effectively absorbed and retained by the metallic filaments.

What I claim is:

1. An improved heat sink device for transferring heat from a heat generator to lower-temperature surroundings by radiation, covection, and conduction, wherein the improvement comprises: a device-embedded compound that absorbs heat at a specific temperature, delaying temperature rise in the heat generator; and a multiplicity of fibers to absorb and retain said compound within the device, both below and above said specific temperature, said fibers being partially exposed as an outer surface of the device providing heat transfer by radiation and convection.

2. A heat sink as in claim 1 wherein said compound melts at said specific temperature absorbing without temperature rise a quantity of heat proportional to the latent heat of fusion of the compound, and said multiplicity of fibers comprises metallic wire structured as a mesh of one or more layers.

3. A heat sink as in claim 2 wherein the constituents of said compound are selected from the group consisting of lead, tin, bismuth, gold, silver, cadmium, antimony, and mercury.

4. A heat sink as in claim 3 wherein said compound is a tertiary eutectic alloy comprising bismuth, lead, and tin.

5. A heat sink as in claim 1 wherein said compound is a wax that melts at said specific temperature absorbing without temperature rise a quantity of heat proportional to the latent heat of fusion of the wax and said multiplicity of fibers are structured as a cloth of one or more layers.

6. A heat sink as in claim 5 wherein said cloth is selected from the group consisting of cotton, nylon, and linen.

7. A heat sink as in claim 1 wherein said compound undergoes an endothermic chemical change at the said specific temperature absorbing heat without appreciable temperature rise.

8. A heat sink as in claim 7 wherein said compound can undergo repeated endothermic chemical change when temperature-cycled above and below said specific temperature.

9. An improved heat sink device for transferring heat from a heat generator to lower-temperature surroundings, wherein the improvement comprises: a device-embedded compound formed in filaments that melt at a specific temperature absorbing without temperature rise a quantity of heat proportional to the latent heat of fusion of said compound delaying temperature rise in the heat generator, said filaments first being wrapped and twisted with many smaller diameter metallic wires to form yarn which is then woven into a mesh used in at least one layer, said metallic wires absorbing and retaining said compound within the device, both below and above said specific temperature.

10. An improved heat sink device for transferring heat from a heat generator to lower-temperature surroundings, wherein the improvement comprises: a device-embedded metallic compound formed in filaments that melt at a specific temperature absorbing without temperature rise a quantity of heat proportional to the latent heat of fusion of said compound delaying temperature rise in the heat generator, said filaments first being wrapped and twisted with many smaller diameter metallic wires to form yarn which is then woven into a mesh used in at least one layer, said metallic wires absorbing and retaining said compound within the device, both below and above said specific temperature.

11. A heat sink as in claim 10 wherein the constituents of said compound are selected from the group consisting of lead, tin, bismuth, gold, silver, cadmium, antimony, and mercury.

12. A heat sink as in claim 11 wherein said compound is a tertiary eutectic alloy comprising bismuth, lead, and tin.

* * * * *